(12) United States Patent
Koga et al.

(10) Patent No.: US 11,923,670 B2
(45) Date of Patent: Mar. 5, 2024

(54) ARC DETECTION DEVICE, SOLAR INVERTER, INDOOR WIRING SYSTEM, CIRCUIT BREAKER, SOLAR PANEL, SOLAR PANEL ATTACHMENT MODULE, AND JUNCTION BOX

(71) Applicant: Panasonic Intellectual Property Management Co., Ltd., Osaka (JP)

(72) Inventors: Tatsuo Koga, Osaka (JP); Kazunori Kidera, Osaka (JP); Keita Kanamori, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 73 days.

(21) Appl. No.: 17/908,317

(22) PCT Filed: Mar. 3, 2021

(86) PCT No.: PCT/JP2021/008291
§ 371 (c)(1),
(2) Date: Aug. 31, 2022

(87) PCT Pub. No.: WO2021/182259
PCT Pub. Date: Sep. 16, 2021

(65) Prior Publication Data
US 2023/0095385 A1    Mar. 30, 2023

(30) Foreign Application Priority Data
Mar. 11, 2020    (JP) ................... 2020-041701

(51) Int. Cl.
*H02H 1/00*    (2006.01)
*G01R 31/40*    (2020.01)
(Continued)

(52) U.S. Cl.
CPC .......... *H02H 1/0015* (2013.01); *G01R 31/40* (2013.01); *H02H 7/268* (2013.01); *H02S 50/00* (2013.01)

(58) Field of Classification Search
CPC .... H02H 1/0015; H02H 7/268; H02H 7/1213; H02H 3/33; H02H 7/20; G01R 31/40;
(Continued)

(56) References Cited

U.S. PATENT DOCUMENTS 9,831,825 B2 *   11/2017   Misumi .................. H02S 50/10
2012/0223679 A1   9/2012   Iwai et al.
(Continued)

FOREIGN PATENT DOCUMENTS

EP    2556573 B1    2/2013
JP    2008-42999 A   2/2008
(Continued)

OTHER PUBLICATIONS

Extended European Search Report dated Aug. 16, 2023 corresponding to European Application No. 21767285.6.
(Continued)

*Primary Examiner* — Giovanni Astacio-Oquendo
(74) *Attorney, Agent, or Firm* — Renner, Otto, Boisselle & Sklar, LLP (57) ABSTRACT

An arc detection device includes: a low-impedance circuit connected between a node on wiring connecting the positive electrode of a DC/DC converter and a plurality of DC/DC converters, extending from the positive electrode of the DC/DC converter, and branching toward the plurality of DC/DC converters and a node on wiring connecting the negative electrode of the DC/DC converter and the plurality of DC/DC converters, extending from the negative electrode of the DC/DC converter, and branching toward the plurality of DC/DC converters; an electric current detector that
(Continued)

detects an electric current flowing through the low-impedance circuit; and an arc determiner that determines, on the basis of the electric current detected by the electric current detector whether an electric arc has occurred.

11 Claims, 6 Drawing Sheets

(51) Int. Cl.
 *H02H 7/26* (2006.01)
 *H02S 50/00* (2014.01)
(58) Field of Classification Search
 CPC ..... G01R 31/1263; G01R 31/14; H02S 50/00; H02S 50/10; H02S 40/30; Y02E 10/50
 USPC .......................................... 324/536, 512, 500
 See application file for complete search history.

(56) References Cited

U.S. PATENT DOCUMENTS

| 2017/0288410 A1 | 10/2017 | Ma et al. |
| 2018/0013292 A1 | 1/2018 | White et al. |
| 2019/0288643 A1* | 9/2019 | Ikemoto ............... H02H 1/0015 |
| 2019/0296539 A1 | 9/2019 | Kanemaru et al. |
| 2021/0035750 A1 | 2/2021 | Miyamoto et al. |
| 2023/0099131 A1* | 3/2023 | Koga ...................... H02S 50/10 324/536 |

FOREIGN PATENT DOCUMENTS

| JP | 2010-231456 A | 10/2010 |
| JP | 2011-7765 A | 1/2011 |
| JP | 2015-2606 A | 1/2015 |
| JP | 2017-161240 A | 9/2017 |
| JP | 2017-161242 A | 9/2017 |
| JP | 6234647 | 11/2017 |
| JP | 2018-506946 A | 3/2018 |
| JP | 2019-184480 A | 10/2019 |
| WO | 2011/065375 A1 | 6/2011 |
| WO | 2016/123305 A1 | 8/2016 |
| WO | 2016/170811 A1 | 10/2016 |
| WO | 2019/208027 A1 | 10/2019 |

OTHER PUBLICATIONS

International Search Report for corresponding Application No. PCT/JP2021/008291, dated May 25, 2021.
Written Opinion for corresponding Application No. PCT/JP2021/008291, dated May 25, 2021.

\* cited by examiner

ARC DETECTION DEVICE, SOLAR INVERTER, INDOOR WIRING SYSTEM, CIRCUIT BREAKER, SOLAR PANEL, SOLAR PANEL ATTACHMENT MODULE, AND JUNCTION BOX

TECHNICAL FIELD

The present invention relates to arc detection devices, solar inverters, indoor wiring systems, circuit breakers, solar panels, solar panel attachment modules, and junction boxes.

BACKGROUND ART

Conventionally, there is a known system that converts direct-current power supplied thereto from a photovoltaic (PV) panel (solar panel) or the like via wiring into alternating-current power using devices such as an inverter. A report indicates that such wiring is damaged or ruptured due to an external factor, degradation over time, or the like. There are cases where an electric arc (i.e., arc discharge) occurs due to damage or the like of such wiring. Thus, an arc detection means for detecting an electric arc has been proposed (for example, Patent Literature (PTL) 1).

CITATION LIST

Patent Literature

[PTL 1] Japanese Unexamined Patent Application Publication No. 2011-007765

SUMMARY OF INVENTION

Technical Problem

In the future, it is expected that a plurality of devices are provided in a single system and electric power is supplied to the plurality of devices through wiring extending from a single direct-current power supply and branching toward the plurality of devices (referred to as branch wiring). At this time, an electric arc may occur in each of the unbranched path and the branched paths of the branch wiring. If the arc detection means is provided in each of the unbranched path and the branched paths of the branch wiring, the electric arc in each of the unbranched path and the branched paths of the branch wiring can be detected, but the size and cost of the system would increase.

Thus, the present invention provides an arc detection device, etc., capable of easily detecting an electric arc occurring in branch wiring.

Solution to Problem

An arc detection device according to one aspect of the present invention includes: a low-impedance circuit connected between a first node on first wiring and a second node on second wiring, the first wiring connecting a positive electrode of a direct-current power supply and a plurality of devices, extending from the positive electrode of the direct-current power supply, and branching toward the plurality of devices, the second wiring connecting a negative electrode of the direct-current power supply and the plurality of devices, extending from the negative electrode of the direct-current power supply, and branching toward the plurality of devices, the low-impedance circuit having impedance lower than impedance of each of the plurality of devices; an electric current detector that detects an electric current flowing through the low-impedance circuit; and an arc determiner that determines, based on the electric current detected by the electric current detector, whether an electric arc has occurred.

A solar inverter according to one aspect of the present invention includes: the above-described arc detection device; and a converter that converts electric power output from the direct-current power supply.

An indoor wiring system according to one aspect of the present invention includes: the above-described arc detection device; the first wiring; the second wiring; and the plurality of devices that are provided indoors.

A circuit breaker according to one aspect of the present invention includes: the above-described arc detection device. When it is determined that an electric arc has occurred, the circuit breaker shuts off the electric current flowing through the first wiring and the second wiring.

A solar panel according to one aspect of the present invention includes: the above-described arc detection device. The solar panel generates electric power using sunlight.

A solar panel attachment module according to one aspect of the present invention includes: the above-described arc detection device. The solar panel attachment module converts a signal to be output from a solar pane.

A junction box according to one aspect of the present invention includes: the above-described arc detection device. The junction box connects a solar panel and a solar inverter.

ADVANTAGEOUS EFFECTS OF INVENTION

According to one aspect of the present invention, an electric arc occurring in branch wiring can be easily detected.

DESCRIPTION OF EMBODIMENTS

Hereinafter, embodiments of the present invention will be described with reference to the Drawings. Note that each embodiment described below shows a specific example of the present invention. The numerical values, shapes, materials, structural elements, the arrangement and connection of the structural elements, etc. shown in the following embodiments are mere examples, and therefore are not intended to limit the present invention.

Note that the figures are schematic diagrams and are not necessarily precise illustrations. In the figures, substantially identical elements are assigned the same reference signs, and overlapping description is omitted or simplified.

Embodiment 1

Figure 1:
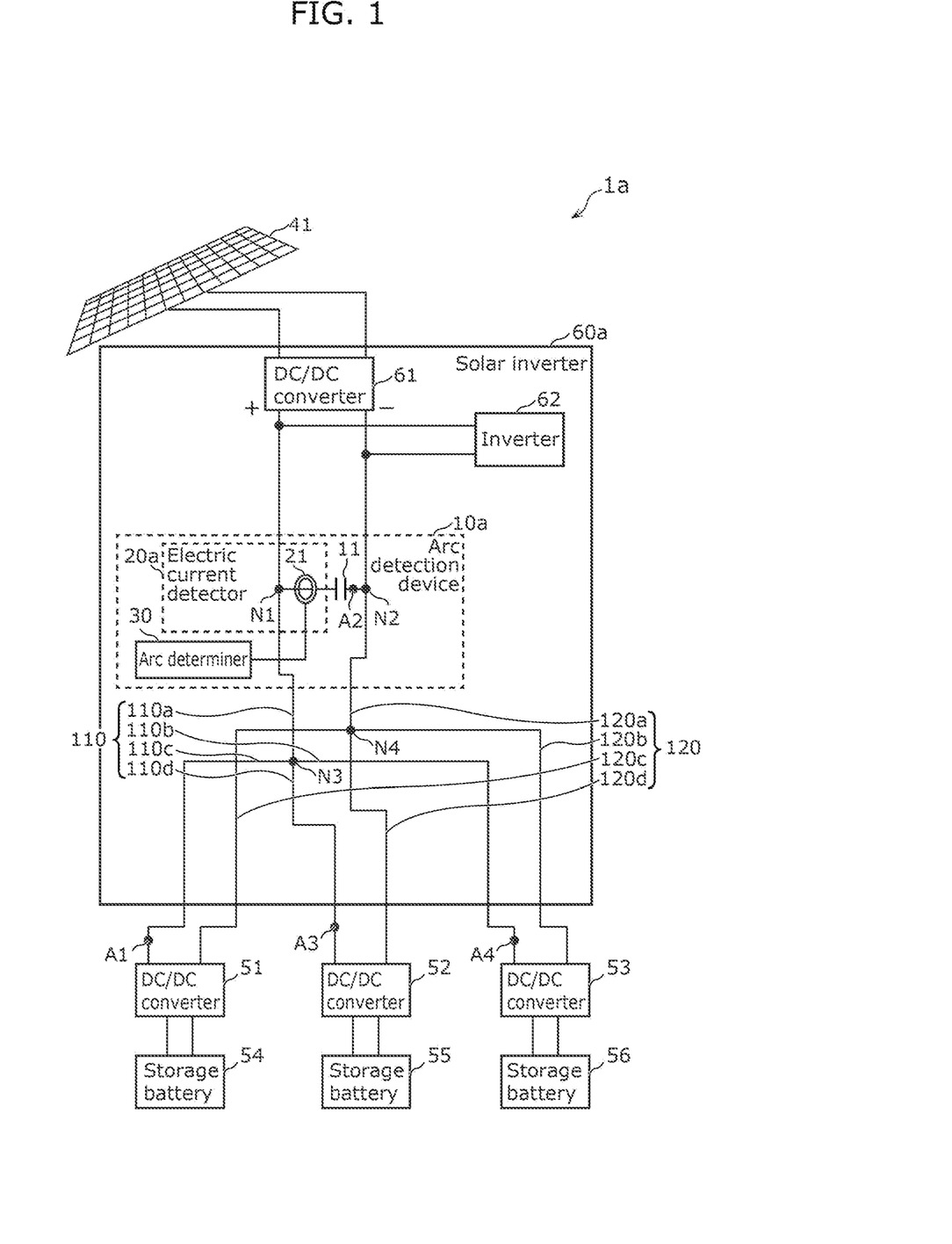
FIG. 1 is a configuration diagram illustrating one example of a solar power generation system according to Embodiment 1.

FIG. 1 is a configuration diagram illustrating one example of solar power generation system 1a according to Embodiment 1.

Solar power generation system 1a includes solar panel 41, storage batteries 54, 55, 56, DC/DC converters 51, 52, 53, and solar inverter 60a.

Solar panel 41 generates direct-current power by generating electric power using sunlight. The direct-current power generated by solar panel 41 is supplied to solar inverter 60a.

Storage battery 54 stores the direct-current power received from DC/DC converter 51, storage battery 55 stores the direct-current power received from DC/DC converter 52, and storage battery 56 stores the direct-current power received from DC/DC converter 53. For example, storage batteries 54, 55, 56 may be installed in an electric vehicle, an electric bicycle, or the like, or may be used to supply electric power to home appliances and the like.

DC/DC converters 51, 52, 53 are voltage converters that increase or decrease the direct-current voltage of the direct-current power supplied thereto. DC/DC converter 51 increases or decreases the voltage of the direct-current power supplied thereto from solar inverter 60a and outputs the direct-current power to storage battery 54. DC/DC converter 52 increases or decreases the voltage of the direct-current power supplied thereto from solar inverter 60a and outputs the direct-current power to storage battery 55. DC/DC converter 53 increases or decreases the voltage of the direct-current power supplied thereto from solar inverter 60a and outputs the direct-current power to storage battery 56.

Solar inverter 60a includes the function of converting the direct-current power supplied thereto from solar panel 41 into alternating-current power. Furthermore, solar inverter 60a includes the function of not converting the direct-current power supplied thereto from solar panel 41 into alternating-current power, but supplying the direct-current power to the storage batteries and the like. Solar inverter 60a includes DC/DC converter 61, inverter 62, and arc detection device 10a.

DC/DC converter 61 increases or decreases the voltage of the direct-current power supplied thereto from solar panel 41 and outputs the direct-current power to DC/DC converters 51, 52, 53 and inverter 62. Since DC/DC converter 61 outputs the direct-current power, DC/DC converter 61 can be regarded as a direct-current power supply. In other words, DC/DC converter 61 is one example of the direct-current power supply. DC/DC converter 61 includes a positive electrode and a negative electrode; wiring 110 is connected to the positive electrode, and wiring 120 is connected to the negative electrode.

Wiring 110, 120 connects DC/DC converter 61 and DC/DC converters 51, 52, 53. Wiring 110 is one example of the first wiring that connects the positive electrode of DC/DC converter 61 and the plurality of devices. Wiring 120 is one example of the second wiring that connects the negative electrode of DC/DC converter 61 and the plurality of devices. DC/DC converters 51, 52, 53 are one example of the plurality of devices connected to DC/DC converter 61 via wiring 110, 120.

Wiring 110 extends from the positive electrode of DC/DC converter 61 and branches toward DC/DC converters 51, 52, 53. A point on wiring 110 at which wiring 110 extending from the positive electrode of DC/DC converter 61 branches toward DC/DC converters 51, 52, 53 is referred to as branch point N3.

In wiring 110, the first unbranched path that is the unbranched path connecting branch point N3 and the positive electrode of DC/DC converter 61 is referred to as path 110a.

Wiring 110 includes a plurality of first branched paths each connecting branch point N3 and one of DC/DC converters 51, 52, 53. In wiring 110, the first branched path connecting branch point N3 and DC/DC converter 51 is referred to as path 110c, the first branched path connecting branch point N3 and DC/DC converter 52 is referred to as path 110d, and the first branched path connecting branch point N3 and DC/DC converter 53 is referred to as path 110b.

Wiring 120 extends from the negative electrode of DC/DC converter 61 and branches toward DC/DC converters 51, 52, 53. A point on wiring 120 at which wiring 120 extending from the negative electrode of DC/DC converter 61 branches toward DC/DC converters 51, 52, 53 is referred to as branch point N4.

In wiring 120, the second unbranched path that is the unbranched path connecting branch point N4 and the negative electrode of DC/DC converter 61 is referred to as path 120a.

Wiring 120 includes a plurality of second branched paths each connecting branch point N4 and one of DC/DC converters 51, 52, 53. In wiring 120, the second branched path connecting branch point N4 and DC/DC converter 51 is referred to as path 120c, the second branched path connecting branch point N4 and DC/DC converter 52 is referred to as path 120d, and the second branched path connecting branch point N4 and DC/DC converter 53 is referred to as path 120b.

Inverter 62 converts the direct-current power supplied thereto from DC/DC converter 61 into alternating-current power and outputs the alternating-current power. Inverter 62, which uses the maximum power point tracking (MPPT) technology, for example, adjusts the electric current and the voltage of the direct-current power supplied thereto from DC/DC converter 61 so as to have values that maximize the electric power. For example, inverter 62 converts the direct-current power into alternating-current power having a voltage of 100 V and a frequency of 50 Hz or 60 Hz. This alternating-current power is used in home appliances and the like.

Wiring 110, 120 is branch wiring; an electric arc may occur in each of the unbranched path and the branched paths of the branch wiring. If the arc detection means is provided in each of the unbranched path and the branched paths, an electric arc can be detected in each of the unbranched path and the branched paths, but the size and cost of the system would increase.

Thus, arc detection device 10a is used in order to easily detect an electric arc occurring in the branch wiring (in this example, wiring 110, 120).

Arc detection device 10a includes low-impedance circuit 11, electric current detector 20a, and arc determiner 30.

Low-impedance circuit 11 is connected between node N1 on wiring 110 and node N2 on wiring 120. Node N1 is one example of the first node, and node N2 is one example of the second node. Low-impedance circuit 11 is, for example, a capacitor. The capacitor, which includes the function of blocking direct-current components, is capable of extracting only high-frequency components from signals flowing through wiring 110, 120. The capacitance value of the capacitor is determined, as appropriate, according to the frequency, etc., of high-frequency components to be extracted. The impedance of low-impedance circuit 11 is lower than that of each of DC/DC converters 51, 52, 53. Furthermore, the impedance of low-impedance circuit 11 is lower than that of DC/DC converter 61. Therefore, in wiring 110, 120, high-frequency components are likely to flow toward low-impedance circuit 11. This will be described in detail later with reference to FIG. 2A to FIG. 2C.

Electric current detector 20a detects an electric current flowing through low-impedance circuit 11. For example, electric current detector 20a detects an electric current flowing through low-impedance circuit 11 by detecting an electric current flowing in the path connecting node N1 and node N2. For example, electric current detector 20a includes magnetic core 21, through which the path connecting node N1 and node N2 extends, and detects an electric current flowing in said path (that is, an electric current flowing through low-impedance circuit 11) according to the magnetic field produced at magnetic core 21.

Magnetic core 21 is in the form of a loop (in this example, the form of a circular ring) through which wiring can extend; an electric current flowing through the wiring extending through the hole of magnetic core 21 produces, at the core, a magnetic field that corresponds to said electric current. Note that magnetic core 21 is not limited to being in the form of a circular ring and may be in the form of a rectangular loop or the like.

Furthermore, electric current detector 20a includes, for example, a Hall element (not illustrated in the drawings) that detects the magnetic field produced at magnetic core 21 and generates a voltage corresponding to the magnetic field produced at magnetic core 21. The voltage generated by the Hall element is input to arc determiner 30 as a signal indicating the magnetic field produced at magnetic core 21, that is, the electric current flowing in the path extending through the magnetic core 21.

Arc determiner 30 is, for example, a microcomputer. The microcomputer is a semiconductor integrated circuit or the like including read-only memory (ROM) and random-access memory (RAM) each having a program stored therein, a processor (a central processing unit) (CPU) that executes the program, a timer, an A/D converter, a D/A converter, and the like. Note that arc determiner 30 may be provided as hardware using a dedicated electronic circuit including an A/D converter, a logical circuit, a gate array, a D/A converter, and the like.

Arc determiner 30 determines, on the basis of the electric current detected by electric current detector 20a, whether an electric arc has occurred. For example, arc determiner 30 determines, by performing a frequency analysis on the electric current detected by electric current detector 20a, whether an electric arc has occurred in wiring 110 or 120. An electric current having superimposed thereon the high-frequency components generated by the occurrence of an electric arc includes frequency components attributed to the electric arc; thus, by detecting said frequency components, it is possible to determine whether an electric arc has occurred. When arc determiner 30 determines that an electric arc has occurred, it is clear that the electric arc has occurred somewhere in wiring 110, 120. This means that the occurrence of an electric arc in branch wiring (in this example, wiring 110, 120) can be detected using only one electric current detector 20a (for example, magnetic core 21).

For example, when an electric arc occurs at point A1 in wiring 110, high-frequency components generated by the occurrence of the electric arc are likely to flow toward low-impedance circuit 11, which will be described below with reference to FIG. 2A to FIG. 2C.

Figure 2A:
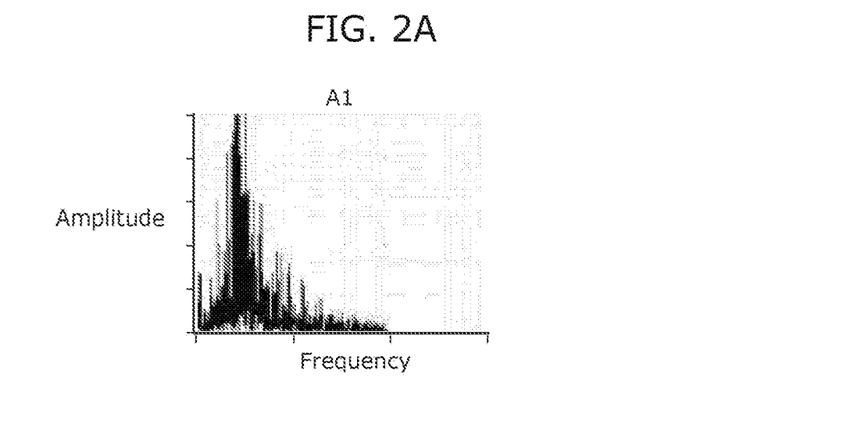
FIG. 2A is a diagram illustrating the frequency spectrum of an electric current flowing through point A1 when an electric arc occurs at point A1.

FIG. 2A is a diagram illustrating the frequency spectrum of an electric current flowing through point A1 when an electric arc occurs at point A1. Point A1 is located in path 110c. Specifically, point A1 is located in the path connecting solar inverter 60a and DC/DC converter 51 in path 110c.

Figure 2B:
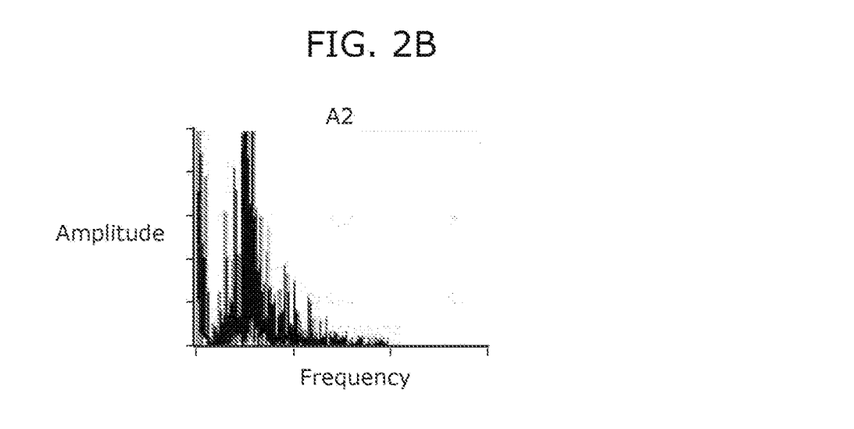
FIG. 2B is a diagram illustrating the frequency spectrum of an electric current flowing through point A2 when an electric arc occurs at point A1.

FIG. 2B is a diagram illustrating the frequency spectrum of an electric current flowing through point A2 when an electric arc occurs at point A1. Point A2 is located in the path connecting node N1 and node N2. This means that the electric current flowing through point A2 flows through low-impedance circuit 11.

Figure 2C:
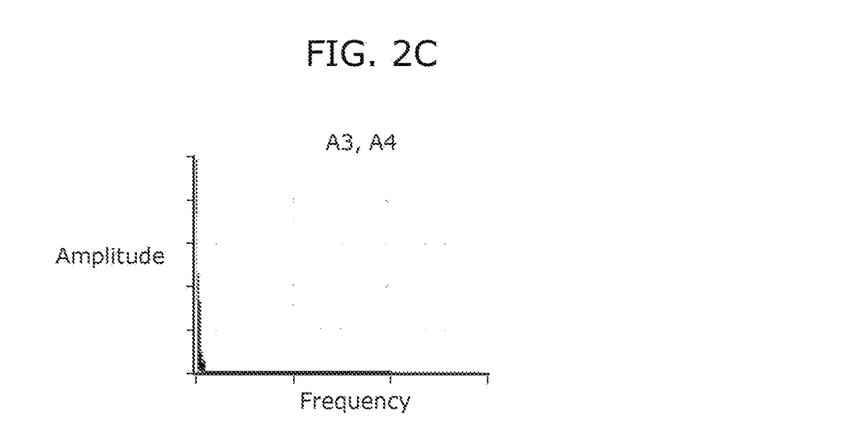
FIG. 2C is a diagram illustrating the frequency spectrum of an electric current flowing through points A3 and A4 when an electric arc occurs at point A1.

FIG. 2C is a diagram illustrating the frequency spectrum of an electric current flowing through points A3 and A4 when an electric arc occurs at point A1. Point A3 is located in path 110d, and point A4 is located in path 110b.

Since the electric arc has occurred at point A1, the frequency spectrum of an electric current having superimposed thereon the high-frequency components generated by the occurrence of the electric arc, such as that illustrated in FIG. 2A, is measured at point A1.

As illustrated in FIG. 2B, a frequency spectrum similar to the frequency spectrum of the electric current having superimposed thereon the high-frequency components generated by the occurrence of the electric arc, such as that illustrated in FIG. 2A, is measured at point A2. This is because the high-frequency components resulting from the electric arc that has occurred at point A1 flow from branch point N3 to path 110a and then, flow from node N1 to low-impedance circuit 11.

On the other hand, as illustrated in FIG. 2C, the frequency spectrum of the electric current having superimposed thereon the high-frequency components generated by the occurrence of the electric arc, such as that illustrated in FIG. 2A, is not measured at point A3 or A4. This is because the impedance of DC/DC converters 52, 53 is higher than the impedance of low-impedance circuit 11 and the high-frequency components are less likely to flow from branch point N3 to paths 110d, 110b.

Thus, it is clear that the high-frequency components resulting from the electric arc that has occurred at point A1 flow to low-impedance circuit 11 having low impedance and are less likely to flow to DC/DC converters 52, 53, 61 having high impedance.

For example, even when an electric arc occurs in other branched paths, high-frequency components generated by the occurrence of the electric arc are less likely to flow to the DC/DC converters having high impedance and are more likely to flow to low-impedance circuit 11 having low impedance.

The foregoing has thus far described an example where node N1 is in path 110a and node N2 is in path 110b; however, in Embodiment 1, node N1 may be in path 110b, 110c, or 110d, and node N2 may be in path 120b, 120c, or 120d.

As described above, arc detection device 10a according to the present embodiment includes: low-impedance circuit 11 connected between the first node (for example, node N1) on the first wiring (for example, wiring 110) connecting the positive electrode of the direct-current power supply (for example, DC/DC converter 61) and the plurality of devices (for example, DC/DC converters 51, 52, 53), extending from the positive electrode of the direct-current power supply, and branching toward the plurality of devices, and the second node (for example, node N2) on the second wiring (for example, wiring 120) connecting the negative electrode of the direct-current power supply and the plurality of devices, extending from the negative electrode of the direct-current power supply, and branching toward the plurality of devices, low-impedance circuit 11 having impedance lower than the impedance of each of the plurality of devices; electric current detector 20a which detects an electric current flowing through low-impedance circuit 11; and arc determiner 30 which determines, on the basis of the electric current detected by electric current detector 20a, whether an electric arc has occurred.

With this, wherever an electric arc occurs in each of the unbranched path and the branched paths (for example, paths 110a, 110b, 110c, 110d, 120a, 120b, 120c, 120d) of the first wiring and the second wiring, the high-frequency components generated by the occurrence of the electric arc flow to low-impedance circuit 11 having impedance lower than the impedance of each of the plurality of devices. Therefore, the electric arc can be detected on the basis of the electric current detected by electric current detector 20a which detects an electric current flowing through low-impedance circuit 11. This means that even when the arc detection means is not provided in each of the unbranched path and the branched paths of the branch wiring, an electric arc occurring in the branch wiring can be detected. In other words, there is no need to increase the size and cost of the system, and an electric arc occurring in the branch wiring can be easily detected using one electric current detector 20a. For example, when an electric arc is detected, DC/DC converter 61 and inverter 62 can be stopped or a circuit breaker (not illustrated in the drawings) or the like provided in each wiring can be operated to shut off an electric current flowing through the wiring, for example, on the basis of the result of the detection.

For example, electric current detector 20a may detect an electric current flowing through low-impedance circuit 11 by detecting an electric current flowing in the path connecting the first node and the second node.

This allows electric current detector 20a to easily detect an electric current flowing through low-impedance circuit 11 provided in the path connecting the first node and the second node.

Solar inverter 60a according to the present embodiment includes: arc detection device 10a; and a converter (for example, inverter 62) that converts electric power output from the direct-current power supply.

Thus, it is possible to provide solar inverter 60a capable of easily detecting an electric arc occurring in the branch wiring.

Variation 1 of Embodiment 1

Figure 3:
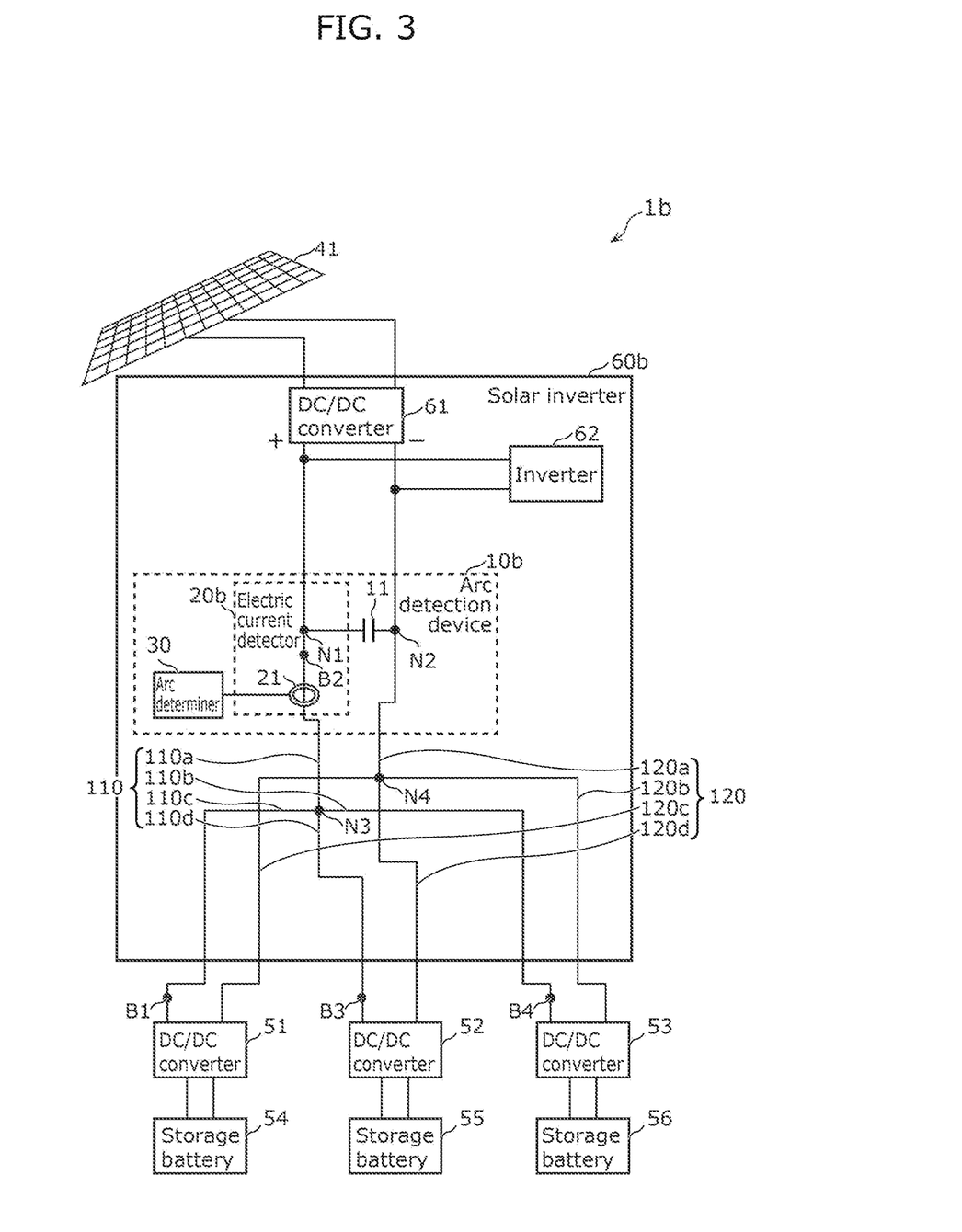
FIG. 3 is a configuration diagram illustrating one example of a solar power generation system according to Variation 1 of Embodiment 1.

Variation 1 of Embodiment 1 describes an example where the electric current detector detects an electric current flowing in path 110a or 120a, which is the unbranched path.

FIG. 3 is a configuration diagram illustrating one example of solar power generation system 1b according to Variation 1 of Embodiment 1.

Solar power generation system 1b is different from solar power generation system 1a according to Embodiment 1 in that solar inverter 60b is included instead of solar inverter 60a. The other features are the same as those in Embodiment 1 and as such, description thereof will be omitted.

Solar inverter 60b includes the function of converting the direct-current power supplied thereto from solar panel 41 into alternating-current power. Furthermore, solar inverter 60b includes the function of not converting the direct-current power supplied thereto from solar panel 41 into alternating-current power, but supplying the direct-current power to the storage batteries and the like. Solar inverter 60b is different from solar inverter 60a according to Embodiment 1 in that arc detection device 10b is included instead of arc detection device 10a. The other features are the same as those in Embodiment 1 and as such, description thereof will be omitted.

Arc detection device 10b includes low-impedance circuit 11, electric current detector 20b, and arc determiner 30. Low-impedance circuit 11 and arc determiner 30 correspond to those according to Embodiment 1 and as such, description thereof will be omitted.

Electric current detector 20b detects an electric current flowing through low-impedance circuit 11. For example, electric current detector 20b detects an electric current flowing through low-impedance circuit 11 by detecting an electric current flowing in path 110a or 120a. Specifically, electric current detector 20b detects an electric current flowing in the path connecting node N1 and branch point N3 in path 110a or the path connecting node N2 and branch point N4 in path 120a. Here, for example, electric current detector 20b includes magnetic core 21, through which path 110a (specifically, the path connecting node N1 and branch point N3 in path 110a) extends, and detects an electric current flowing in said path (that is, an electric current flowing through low-impedance circuit 11) according to the magnetic field produced at magnetic core 21.

For example, when an electric arc occurs at point B1 in wiring 110, high-frequency components generated by the occurrence of the electric arc are likely to flow toward low-impedance circuit 11, and it is possible to detect the electric arc by detecting an electric current flowing in path 110a, which will be described below with reference to FIG. 2A to FIG. 2C. Note that point A1, point A2, point A3, and point A4 in FIG. 2A to FIG. 2C can be read as point B1, point B2, point B3, and point B4, respectively.

Point B1 is located in path 110c. Specifically, point B1 is located in the path connecting solar inverter 60b and DC/DC converter 51 in path 110c. Point B2 is located in the path connecting node N1 and branch point N3 in path 110a. Point B3 is located in path 110d, and point B4 is located in path 110b.

Since the electric arc has occurred at point B1, the frequency spectrum of an electric current having superimposed thereon the high-frequency components generated by the occurrence of the electric arc, such as that illustrated in FIG. 2A, is measured at point B1.

As illustrated in FIG. 2B, a frequency spectrum similar to the frequency spectrum of the electric current having superimposed thereon the high-frequency components generated by the occurrence of the electric arc, such as that illustrated in FIG. 2A, is measured at point B2. This is because the high-frequency components resulting from the electric arc that has occurred at point B1 flow from branch point N3 to path 110a, pass through point B2, and then flow from node N1 to low-impedance circuit 11.

On the other hand, as illustrated in FIG. 2C, the frequency spectrum of the electric current having superimposed thereon the high-frequency components generated by the occurrence of the electric arc, such as that illustrated in FIG. 2A, is not measured at point B3 or B4. This is because the impedance of DC/DC converters 52, 53 is higher than the impedance of low-impedance circuit 11 and the high-frequency components are less likely to flow from branch point N3 to paths 110*d*, 110*b*.

Thus, it is clear that the high-frequency components resulting from the electric arc that has occurred at point B1 flow to low-impedance circuit 11 having low impedance and are less likely to flow to DC/DC converters 52, 53, 61 having high impedance. Furthermore, it is clear that the electric arc can be detected by detecting an electric current flowing in path 110*a* (specifically, the path connecting node N1 and branch point N3 in path 110*a*).

For example, even when an electric arc occurs in other branched paths, high-frequency components generated by the occurrence of the electric arc are less likely to flow to the DC/DC converters having high impedance and are more likely to flow to low-impedance circuit 11 having low impedance.

In Variation 1 of Embodiment 1, it is possible to detect an electric arc occurring in the path connecting node N1 and branch point N3 in path 110*a*, path 110*b*, 110*c*, or 110*d*, the path connecting node N2 and branch point N4 in path 120*a*, or path 120*b*, 120*c*, or 120*d*.

In Embodiment 1, node N1 may be located in path 110*b*, 110*c*, or 110*d* and node N2 may be located in path 120*b*, 120*c*, or 120*d*, as described above, but in Variation 1 of Embodiment 1, node N1 needs to be located in path 110*a* and node N2 needs to be located in path 120*a*. This is to allow the high-frequency components to flow in path 110*a* or 120*a* from which electric current detector 20*b* detects an electric current.

As described above, the first node (for example, node N1) is located in the first unbranched path (for example, path 110*a*) connecting the positive electrode of the direct-current power supply (for example, DC/DC converter 61) and branch point N3 at which the first wiring (for example, wiring 110) extending from the positive electrode of the direct-current power supply branches toward the plurality of devices (for example, DC/DC converters 51, 52, 53).

The second node (for example, node N2) is located in the second unbranched path (for example, path 120*a*) connecting the negative electrode of the direct-current power supply and branch point N4 at which the second wiring (for example, wiring 120) extending from the negative electrode of the direct-current power supply branches toward the plurality of devices. Electric current detector 20*b* detects an electric current flowing through low-impedance circuit 11 by detecting an electric current flowing in the first unbranched path or the second unbranched path.

In this manner, electric current detector 20*b* may detect an electric current flowing through low-impedance circuit 11 by detecting an electric current flowing in the first unbranched path or the second unbranched path.

Variation 2 of Embodiment 1

Figure 4:
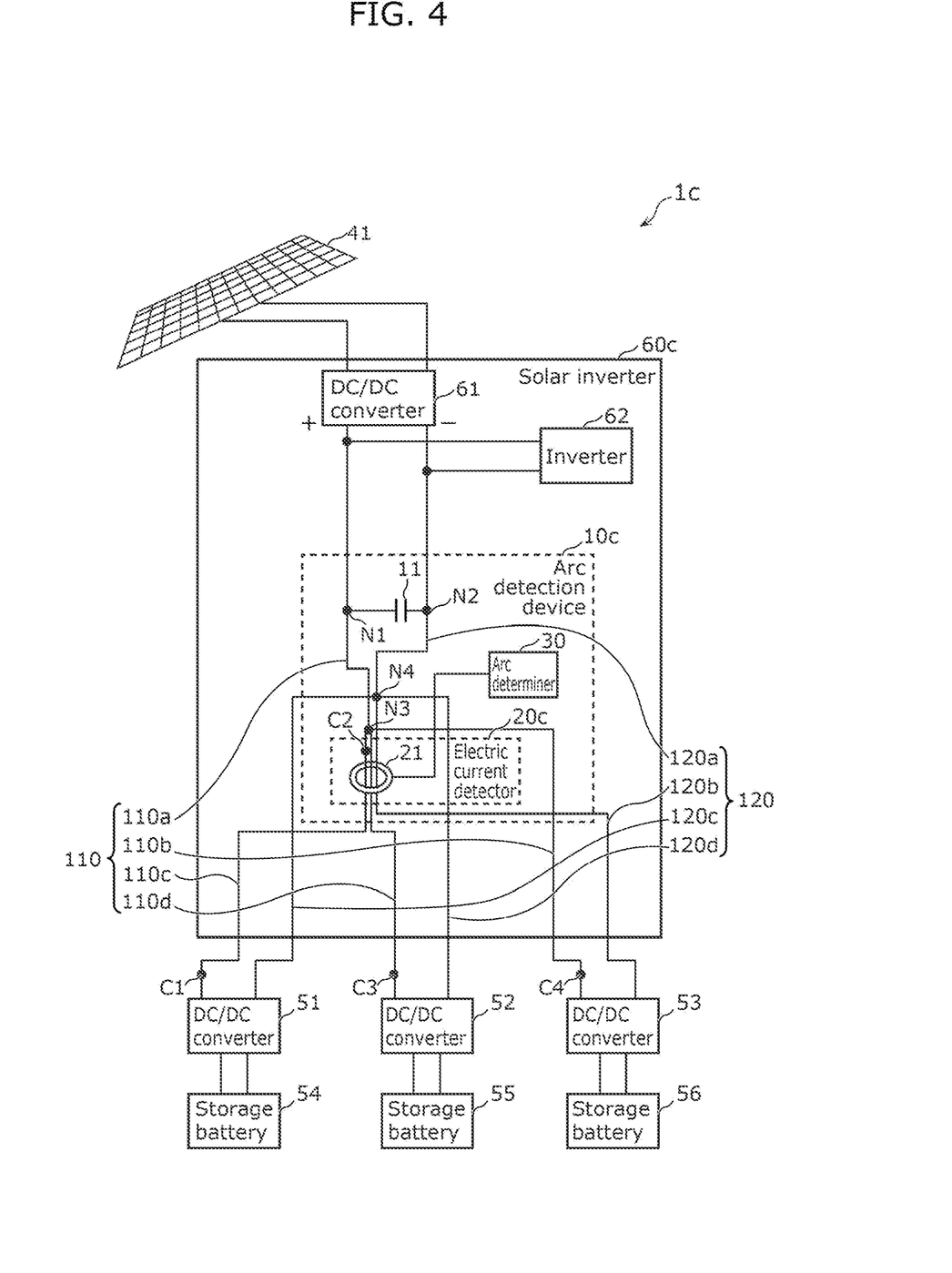
FIG. 4 is a configuration diagram illustrating one example of a solar power generation system according to Variation 2 of Embodiment 1.

Variation 2 of Embodiment 1 describes an example where the electric current detector detects an electric current flowing in path 110*b*, 110*c*, 110*d*, 120*b*, 120*c*, or 120*d*, which is the branched path.

FIG. 4 is a configuration diagram illustrating one example of solar power generation system 1*c* according to Variation 2 of Embodiment 1.

Solar power generation system 1*c* is different from solar power generation system 1*a* according to Embodiment 1 in that solar inverter 60*c* is included instead of solar inverter 60*a*. The other features are the same as those in Embodiment 1 and as such, description thereof will be omitted.

Solar inverter 60*c* includes the function of converting the direct-current power supplied thereto from solar panel 41 into alternating-current power. Furthermore, solar inverter 60*c* includes the function of not converting the direct-current power supplied thereto from solar panel 41 into alternating-current power, but supplying the direct-current power to the storage batteries and the like. Solar inverter 60*c* is different from solar inverter 60*a* according to Embodiment 1 in that arc detection device 10*c* is included instead of arc detection device 10*a*. The other features are the same as those in Embodiment 1 and as such, description thereof will be omitted.

Arc detection device 10*c* includes low-impedance circuit 11, electric current detector 20*c*, and arc determiner 30. Low-impedance circuit 11 and arc determiner 30 correspond to those according to Embodiment 1 and as such, description thereof will be omitted.

Electric current detector 20*c* detects an electric current flowing through low-impedance circuit 11. For example, electric current detector 20*c* detects an electric current flowing through low-impedance circuit 11 by detecting, for each of DC/DC converters 51, 52, 53, an electric current in a corresponding one of the first branched path and the second branched path. Specifically, electric current detector 20*c* detects an electric current flowing in one of paths 110*c* and 120*c* that corresponds to DC/DC converter 51, detects an electric current flowing in one of paths 110*d* and 120*d* that corresponds to DC/DC converter 52, and detects an electric current flowing in one of paths 110*b* and 120*b* that corresponds to DC/DC converter 53. Here, for example, electric current detector 20*c* includes magnetic core 21, through which paths 110*c*, 110*d*, 120*b* extend as one of the first branched path and the second branched path that is different for each of DC/DC converters 51, 52, 53, and detects electric currents flowing in paths 110*c*, 110*d*, 120*b* (that is, an electric current flowing through low-impedance circuit 11) according to the magnetic field produced at magnetic core 21.

For example, when an electric arc occurs at point C1 in wiring 110, high-frequency components generated by the occurrence of the electric arc are likely to flow toward low-impedance circuit 11, and it is possible to detect the electric arc by collectively detecting electric currents flowing in paths 110*c*, 110*d*, 120*b*, which will be described below with reference to FIG. 2A to FIG. 2C. Note that point A1, point A2, point A3, and point A4 in FIG. 2A to FIG. 2C can be read as point C1, point C2, point C3, and point C4, respectively.

Point C1 is located in path 110*c*. Specifically, point C1 is located in the path connecting solar inverter 60*c* and DC/DC converter 51 in path 110*c*. Point C2 is located in path 110*c* (specifically, path 110*c* inside solar inverter 60*c*). Point C3 is located in path 110*d*, and point C4 is located in path 110*b*.

Since the electric arc has occurred at point C1, the frequency spectrum of an electric current having superimposed thereon the high-frequency components generated by the occurrence of the electric arc, such as that illustrated in FIG. 2A, is measured at point C1.

As illustrated in FIG. 2B, a frequency spectrum similar to the frequency spectrum of the electric current having superimposed thereon the high-frequency components generated by the occurrence of the electric arc, such as that illustrated in FIG. 2A, is measured at point C2. This is because the high-frequency components resulting from the electric arc that has occurred at point C1 pass through point C2, flow from branch point N3 to path 110a, and then flow from node N1 to low-impedance circuit 11.

On the other hand, as illustrated in FIG. 2C, the frequency spectrum of the electric current having superimposed thereon the high-frequency components generated by the occurrence of the electric arc, such as that illustrated in FIG. 2A, is not measured at point C3 or C4. This is because the impedance of DC/DC converters 52, 53 is higher than the impedance of low-impedance circuit 11 and the high-frequency components are less likely to flow from branch point N3 to paths 110d, 110b.

Thus, it is clear that the high-frequency components resulting from the electric arc that has occurred at point C1 flow to low-impedance circuit 11 having low impedance and are less likely to flow to DC/DC converters 52, 53, 61 having high impedance. Furthermore, it is clear that an electric arc can be detected by collectively detecting electric currents flowing in paths 110c, 110d, 120b.

For example, even when an electric arc occurs in other branched paths, high-frequency components generated by the occurrence of the electric arc are less likely to flow to the DC/DC converters having high impedance and are more likely to flow to low-impedance circuit 11 having low impedance.

For example, the paths each being one of the first branched path and the second branched path that is different for each of DC/DC converters 51, 52, 53 include at least one first branched path and at least one second branched path. Here, the paths each being one of the first branched path and the second branched path that is different for each of DC/DC converters 51, 52, 53 include paths 110c, 110d as at least one first branched path and path 120b as at least one second branched path.

In Variation 2 of Embodiment 1, it is possible to detect an electric arc occurring in the path connecting node N1 and branch point N3 in path 110a, path 110b, 110c, or 110d, the path connecting node N2 and branch point N4 in path 120a, or path 120b, 120c, or 120d.

In Variation 2 of Embodiment 1, node N1 may be located in path 110b, 110c, or 110d, and node N2 may be located in path 120b, 120c, or 120d, as in Embodiment 1.

As described above, the first wiring (for example, wiring 110) includes the plurality of first branched paths (for example, paths 110b, 110c, 110d) each connecting one of the plurality of devices (for example, DC/DC converters 51, 52, 53) and branch point N3 at which the first wiring extending from the positive electrode of the direct-current power supply (for example, DC/DC converter 61) branches toward the plurality of devices. The second wiring (for example, wiring 120) includes the plurality of second branched paths (for example, paths 120b, 120c, 120d) each connecting one of the plurality of devices and branch point N4 at which the second wiring extending from the negative electrode of the direct-current power supply branches toward the plurality of devices. Electric current detector 20c includes magnetic core 21, through which paths each being one of the first branched path and the second branched path that is different for each of the plurality of devices extends, and detects an electric current flowing through low-impedance circuit 11 by detecting, for each of the plurality of devices, an electric current flowing in the corresponding one of the paths according to the magnetic field produced at magnetic core 21.

In this manner, electric current detector 20c may detect an electric current flowing through low-impedance circuit 11 by detecting, for each of the plurality of devices, an electric current flowing in the corresponding one of the first branched path and the second branched path.

For example, the paths each being one of the first branched path and the second branched path that is different for each of the plurality of devices may include at least one first branched path and at least one second branched path.

For example, in the first branched path and the second branched path, high direct currents flow and thus, magnetic saturation may occur at magnetic core 21. Therefore, when an electric arc occurs, there is a risk that an arc-induced electric current (high-frequency components) superimposed on the direct current flowing in the first branched path or the second branched path cannot be accurately detected due to the magnetic saturation caused by the direct current. In this regard, the paths each being one of the first branched path and the second branched path that extends through magnetic core 21 and is different for each of the plurality of devices include the first and second branched paths in which the direct currents flow in opposite directions, and thus the magnetic field produced by the direct current flowing in the first branched path and the magnetic field produced by the direct current flowing in the second branched path can be canceled out, preventing the magnetic saturation. Therefore, an electric arc occurring in the branch wiring can be accurately detected.

Embodiment 2

Embodiment 1 has thus far described an example where the arc detection device is provided in the solar power generation system (specifically, the solar inverter), but the arc detection device may be provided in an indoor wiring system. This will be described with reference to FIG. 5.

Figure 5:
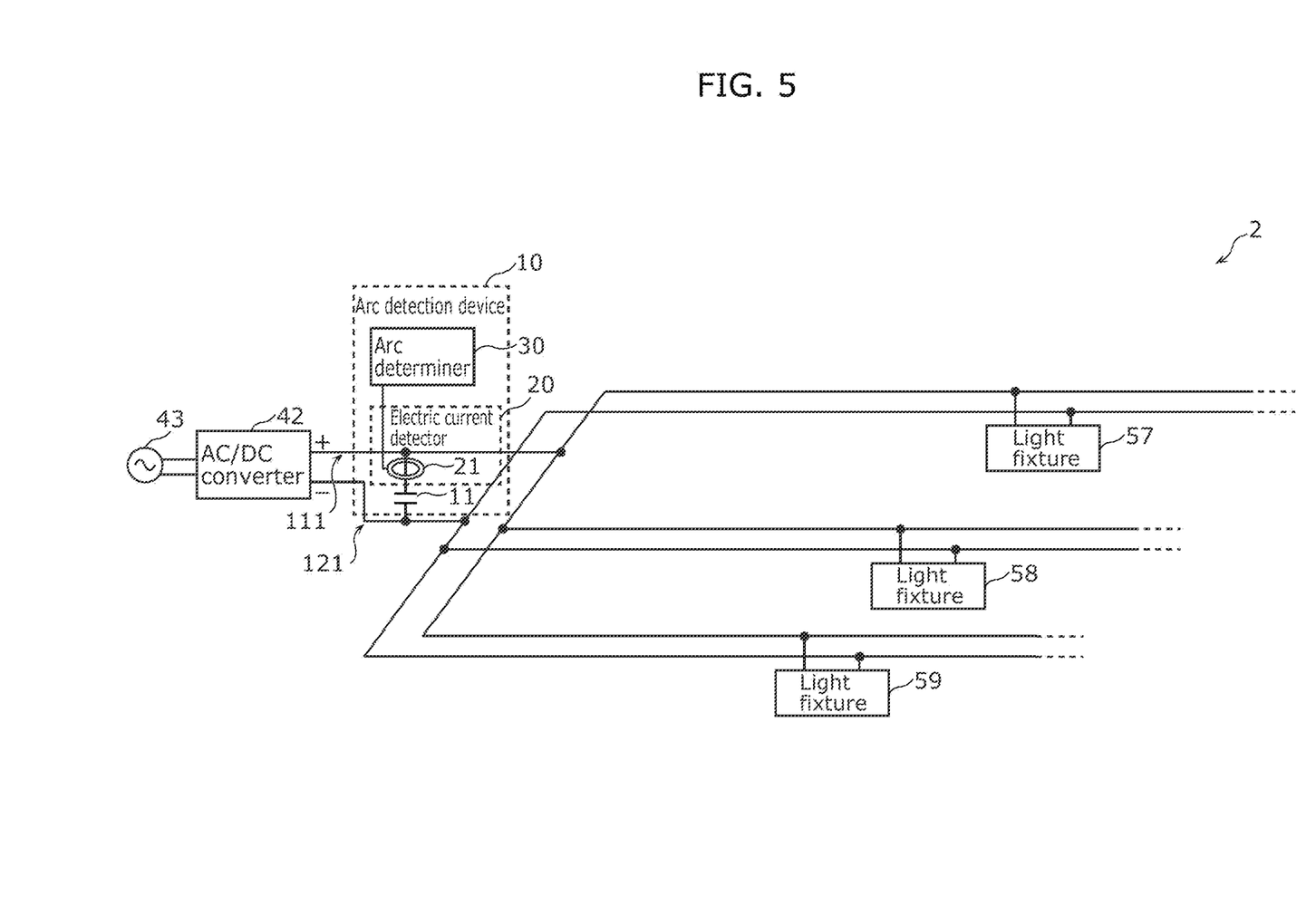
FIG. 5 is a configuration diagram illustrating one example of an indoor wiring system according to Embodiment 2.

FIG. 5 is a configuration diagram illustrating one example of indoor wiring system 2 according to Embodiment 2. Note that system power supply 43 connected to indoor wiring system 2 is also illustrated in FIG. 5.

System power supply 43 supplies alternating-current power generated at a power station or the like.

Indoor wiring system 2 includes AC/DC converter 42, wiring 111, 121, light fixtures 57, 58, 59, and arc detection device 10. AC/DC converter 42, wiring 111, 121, light fixtures 57, 58, 59, and arc detection device 10 are installed inside a facility such as a detached house, an apartment, a building, or a factory.

AC/DC converter 42 is an electric power converter that receives the alternating-current power from system power supply 43, converts the received alternating-current power into direct-current power, and outputs the direct-current power. Since AC/DC converter 42 outputs the direct-current power, AC/DC converter 42 can be regarded as a direct-current power supply.

AC/DC converter 42 converts, into direct-current power, the alternating-current power supplied from system power supply 43, and outputs the direct-current power to light fixtures 57, 58, 59. AC/DC converter 42 includes a positive electrode and a negative electrode; wiring 111 is connected to the positive electrode, and wiring 121 is connected to the negative electrode.

Wiring 111, 121 connects AC/DC converter 42 and light fixtures 57, 58, 59. Wiring 111 is one example of the first wiring that connects the positive electrode of AC/DC converter 42 and the plurality of devices. Wiring 121 is one example of the second wiring that connects the negative electrode of AC/DC converter 42 and the plurality of devices. Light fixtures 57, 58, 59 are one example of the plurality of devices connected to AC/DC converter 42 via wiring 111, 121.

Similar to wiring 110 according to Embodiment 1, wiring 111 extends from the positive electrode of AC/DC converter 42 and branches toward light fixtures 57, 58, 59. Similar to wiring 120 according to Embodiment 1, wiring 121 extends from the negative electrode of AC/DC converter 42 and branches toward light fixtures 57, 58, 59.

Note that the plurality of devices are not limited to the light fixtures and may be any devices provided indoors. For example, the plurality of devices may be loudspeakers, microphones, or the like.

Wiring 111, 121 is branch wiring; an electric arc may occur in each of the unbranched path and the branched paths of the branch wiring. If the arc detection means is provided in each of the unbranched path and the branched paths, an electric arc can be detected in each of the unbranched path and the branched paths, but the size and cost of the system would increase.

Thus, arc detection device 10 is used in order to easily detect an electric arc occurring in the branch wiring (in this example, wiring 111, 121).

Arc detection device 10 includes low-impedance circuit 11, electric current detector 20, and arc determiner 30.

Low-impedance circuit 11 is connected between the first node on wiring 111 and the second node on wiring 121. Low-impedance circuit 11 has the same function as the function of that according to Embodiment 1 and as such, description thereof will be omitted.

Electric current detector 20 detects an electric current flowing through low-impedance circuit 11. For example, electric current detector 20 detects an electric current flowing through low-impedance circuit 11 by detecting an electric current flowing in the path connecting the first node on wiring 111 and the second node on wiring 121. For example, electric current detector 20 includes magnetic core 21, through which the path connecting the first node on wiring 111 and the second node on wiring 121 extends, and detects an electric current flowing in said path (that is, an electric current flowing through low-impedance circuit 11) according to the magnetic field produced at magnetic core 21. Note that electric current detector 20 may detect an electric current flowing in the unbranched path of the branch wiring as in Variation 1 of Embodiment 1, or may detect an electric current flowing in the branched path of the branch wiring as in Variation 2 of Embodiment 1.

Arc determiner 30 determines, on the basis of the electric current detected by electric current detector 20, whether an electric arc has occurred. Arc determiner 30 has the same function as the function of that according to Embodiment 1 and as such, description thereof will be omitted.

In indoor wiring system 2, the high-frequency components resulting from the electric arc that has occurred in wiring 111 or 121 are also likely to flow to low-impedance circuit 11.

As described above, indoor wiring system 2 according to the present embodiment includes arc detection device 10, the first wiring (for example, wiring 111), the second wiring (for example, wiring 121), and the plurality of devices (for example, light fixtures 57, 58, 59) provided indoors.

Thus, arc detection device 10 may be applied to indoor wiring system 2; it is possible to provide indoor wiring system 2 capable of easily detecting an electric arc occurring in the branch wiring.

Other Embodiments

The arc detection device, etc., according to the embodiments have been described thus far, but the present invention is not limited to the embodiments described above.

For example, the configuration of the electric current detector is not limited to the configuration in which magnetic core 21 is included. For example, the electric current detector may include a resistive element having a small resistance value. This is because the difference in potential at the resistive element that results from an electric current flowing through the resistive element has a value corresponding to the electric current flowing through the resistive element, meaning that the resistive element functions as an electric current sensor.

For example, the embodiments have thus far described examples where the arc detection device is applied to the solar power generation system (specifically, the solar inverter) and the indoor wiring system, but the examples of application are not limited to these examples. Other examples of application of the arc detection device according to the present invention (specifically, the arc detection device capable of easily detecting an electric arc occurring in the branch wiring) will be described with reference to FIG. 6.

Figure 6:
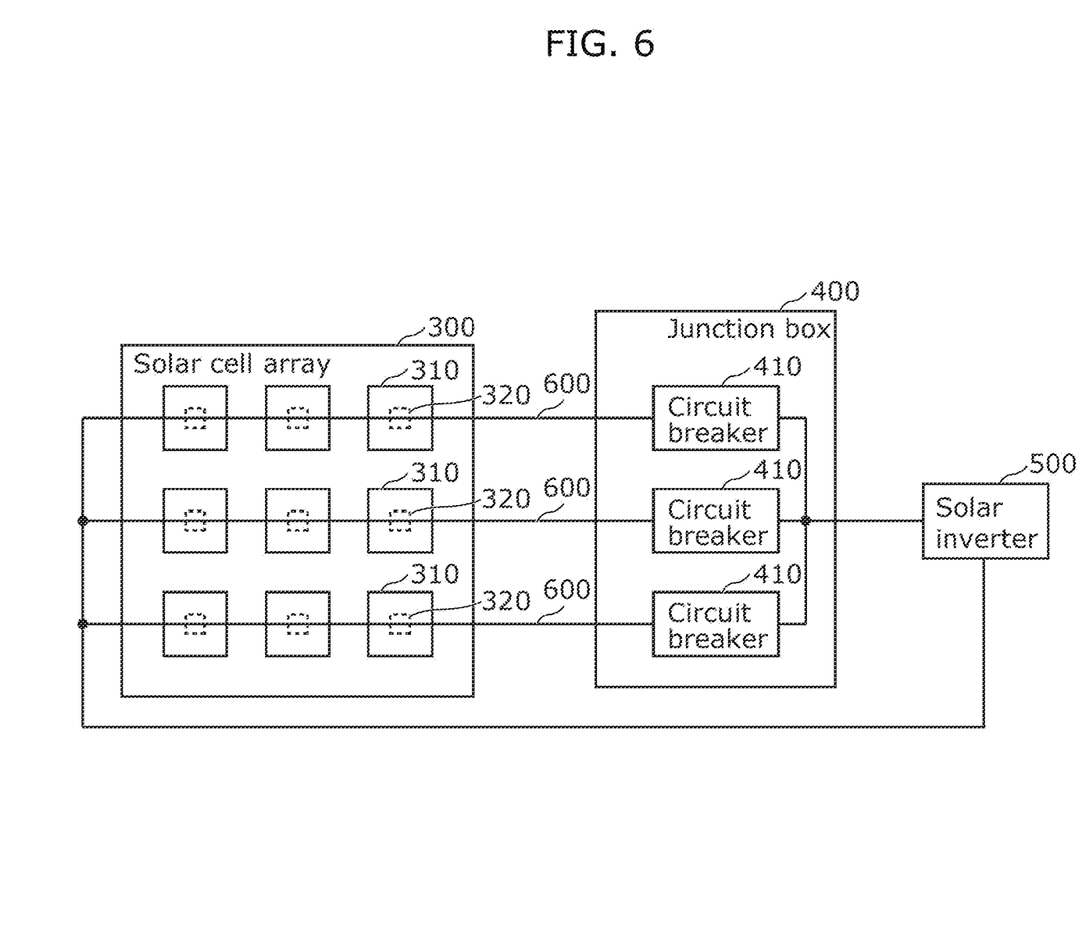
FIG. 6 is a diagram for describing an example of application of an arc detection device according to the present invention.

FIG. 6 is a diagram for describing an example of application of an arc detection device according to the present invention.

The arc detection device according to the present invention is applied to each structural element of a system in which solar inverter 500 converts direct-current power supplied thereto from solar panel 310 through wiring into alternating-current power, for example. In this example, two or more (for example, three) sets of two or more (for example, three) solar panels 310 connected in series by a single line (string) of wiring 600 are arranged to form solar cell array 300. Two or more lines of wiring 600 are put together by junction box 400 and are connected to solar inverter 500. The direct-current power supply is solar panel 310, the first wiring is wiring 600 connected to the positive electrode of solar panel 310, and the second wiring is wiring 600 connected to the negative electrode of solar panel 310. Wiring 600 branches inside solar inverter 500.

For example, circuit breaker 410 is provided for each line of wiring 600; in this example, circuit breaker 410 is provided in junction box 400. Note that circuit breaker 410 does not need to be provided in junction box 400. For example, circuit breaker 410 may be provided between junction box 400 and solar cell array 300 or may be provided between junction box 400 and solar inverter 500 instead of being provided for each line of wiring 600.

Solar panel 310 includes solar panel attachment module 320 which converts a signal to be output from solar panel 310, for example. Solar panel attachment module 320 is, for example, a DC/DC converter that optimizes the amount of electric power to be generated by each solar panel 310. Note that solar panel 310 does not need to include solar panel attachment module 320.

For example, circuit breaker 410 may include the arc detection device. When it is determined that an anomaly has occurred, circuit breaker 410 shuts off an electric current flowing through wiring 600.

For example, solar panel 310 or solar panel attachment module 320 may include the arc detection device. When it is determined that an electric arc has occurred, solar panel 310 or solar panel attachment module 320 stops the output to wiring 600.

Furthermore, for example, junction box 400 may include the arc detection device. When it is determined that an electric arc has occurred, junction box 400 shuts off, via circuit breaker 410 or the like, an electric current flowing through wiring 600, for example.

Note that the arc detection device according to the present invention can be applied to not only those cited above, but also any system in which an electric arc needs to be detected.

Thus, circuit breaker 410 may include the arc detection device, and when it is determined that an electric arc has occurred, shut off electric currents flowing through the first wiring and the second wiring. Solar panel 310 may include the arc detection device and may generate electric power using sunlight. Solar panel attachment module 320 may include the arc detection device and may convert a signal to be output from solar panel 310. Junction box 400 may include the arc detection device and may connect solar panel 310 and solar inverter 500.

For example, the arc determiner included in the arc detection device may be provided as software for a general-purpose computer such as a personal computer.

Forms obtained by various modifications to the embodiments that can be conceived by a person having ordinary skill in the art, and forms configured by arbitrarily combining structural elements and functions in different embodiments which are within the scope of the essence of the present invention are included in the present invention.

The invention claimed is:

1. An arc detection device comprising:
a low-impedance circuit connected between a first node on first wiring and a second node on second wiring, the first wiring connecting a positive electrode of a direct-current power supply and a plurality of devices, extending from the positive electrode of the direct-current power supply, and branching toward the plurality of devices, the second wiring connecting a negative electrode of the direct-current power supply and the plurality of devices, extending from the negative electrode of the direct-current power supply, and branching toward the plurality of devices, the low-impedance circuit having impedance lower than impedance of each of the plurality of devices;
an electric current detector that detects an electric current flowing through the low-impedance circuit; and
an arc determiner that determines, based on the electric current detected by the electric current detector, whether an electric arc has occurred.

2. The arc detection device according to claim 1, wherein the electric current detector detects the electric current flowing through the low-impedance circuit by detecting the electric current flowing in a path connecting the first node and the second node.

3. The arc detection device according to claim 1, wherein the first node is located in a first unbranched path connecting the positive electrode of the direct-current power supply and a branch point of the first wiring between the positive electrode of the direct-current power supply and each of the plurality of devices,
the second node is located in a second unbranched path connecting the negative electrode of the direct-current power supply and a branch point of the second wiring between the negative electrode of the direct-current power supply and each of the plurality of devices, and
the electric current detector detects the electric current flowing through the low-impedance circuit by detecting the electric current flowing in the first unbranched path or the second unbranched path.

4. The arc detection device according to claim 1, wherein the first wiring includes a plurality of first branched paths each connecting one of the plurality of devices and a branch point of the first wiring between the positive electrode of the direct-current power supply and each of the plurality of devices,
the second wiring includes a plurality of second branched paths each connecting one of the plurality of devices and a branch point of the second wiring between the negative electrode of the direct-current power supply and each of the plurality of devices, and
the electric current detector includes a magnetic core through which paths each being a corresponding one of the first branched path and the second branched path that is different for each of the plurality of devices extend, and the electric current detector detects the electric current flowing through the low-impedance circuit by detecting, for each of the plurality of devices, the electric current flowing in the corresponding one of the first branched path and the second branched path according to a magnetic field produced at the magnetic core.

5. The arc detection device according to claim 4, wherein the paths each being one of the first branched path and the second branched path that is different for each of the plurality of devices include at least one first branched path and at least one second branched path.

6. A solar inverter comprising:
the arc detection device according to claim 1; and
a converter that converts electric power output from the direct-current power supply.

7. An indoor wiring system comprising:
the arc detection device according to claim 1;
the first wiring;
the second wiring; and
the plurality of devices that are provided indoors.

8. A circuit breaker comprising:
the arc detection device according to claim 1, wherein when it is determined that an electric arc has occurred, the circuit breaker shuts off the electric current flowing through the first wiring and the second wiring.

9. A solar panel comprising:
the arc detection device according to claim 1, wherein the solar panel generates electric power using sunlight.

10. A solar panel attachment module comprising:
the arc detection device according to claim 1, wherein the solar panel attachment module converts a signal to be output from a solar panel.

11. A junction box comprising:
the arc detection device according to claim 1, wherein the junction box connects a solar panel and a solar inverter.

* * * * *